United States Patent
Fujikawa

(10) Patent No.: US 11,217,134 B2
(45) Date of Patent: Jan. 4, 2022

(54) TEMPERATURE DETECTION CIRCUIT, ELECTRO-OPTICAL DEVICE, AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/060,791

(22) Filed: Oct. 1, 2020

(65) Prior Publication Data

US 2021/0104186 A1  Apr. 8, 2021

(30) Foreign Application Priority Data

Oct. 2, 2019 (JP) .............................. JP2019-181960

(51) Int. Cl.
  *G09G 3/00* (2006.01)
  *H01L 27/12* (2006.01)
  *G02F 1/1362* (2006.01)
  *G09G 3/36* (2006.01)

(52) U.S. Cl.
  CPC ....... *G09G 3/006* (2013.01); *G02F 1/136204* (2013.01); *G09G 3/3607* (2013.01); *H01L 27/1255* (2013.01); *G09G 2320/041* (2013.01)

(58) Field of Classification Search
  CPC .............. G09G 3/006; G09G 2320/041; H01L 27/1255; G02F 1/136204
  See application file for complete search history.

(56) References Cited

U.S. PATENT DOCUMENTS

| 2007/0278488 A1 | 12/2007 | Hirabayashi et al. |
| 2007/0281430 A1 | 12/2007 | Hirabayashi et al. |
| 2016/0238911 A1* | 8/2016 | Yoshii ............... G02F 1/136204 |
| 2016/0284446 A1* | 9/2016 | Fujikawa ............... H01L 27/04 |
| 2016/0329012 A1* | 11/2016 | Miyata ................. G02F 1/167 |

FOREIGN PATENT DOCUMENTS

| JP | H09-080471 A | 3/1997 |
| JP | 2007-322761 A | 12/2007 |
| JP | 2007-324375 A | 12/2007 |
| JP | 2009-176779 A | 8/2009 |
| JP | 2016-184719 A | 10/2016 |

\* cited by examiner

*Primary Examiner* — Shaheda A Abdin
(74) *Attorney, Agent, or Firm* — Oliff PLC

(57) ABSTRACT

In a temperature detection circuit of an electro-optical device, an electrostatic protection circuit includes a first wiring line, a first transistor provided with a first source/drain region electrically connected to the first wiring line, and a second wiring line electrically connected to a second source/drain region of the first transistor. A temperature detection element includes diodes electrically connected in series between the first wiring line and the second wiring line. A compensation circuit includes a second transistor, a constant potential Vc is applied to the first source/drain region of the second transistor, and a gate electrode and the second source/drain region of the second transistor are electrically connected to the first wiring line.

10 Claims, 9 Drawing Sheets

FIG. 5A 30°C
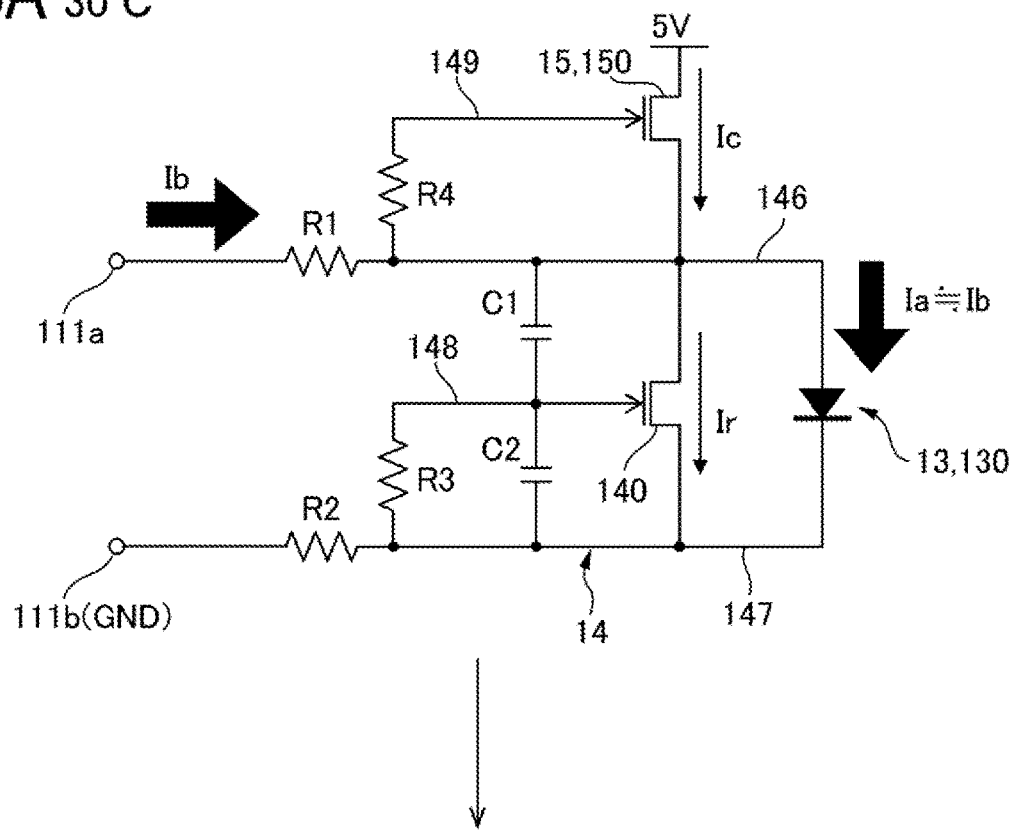
FIG. 5B 80°C
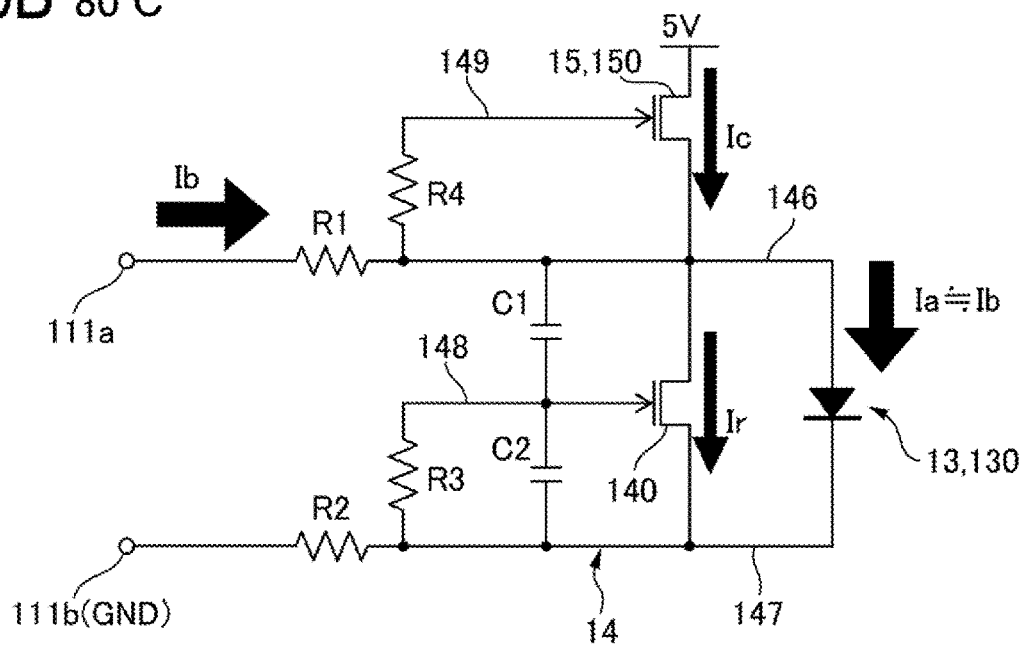

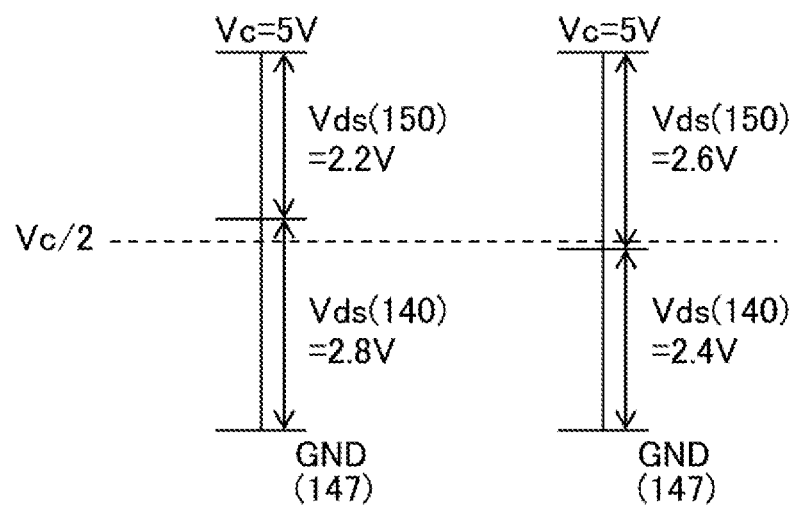

FIG. 7A 30°C
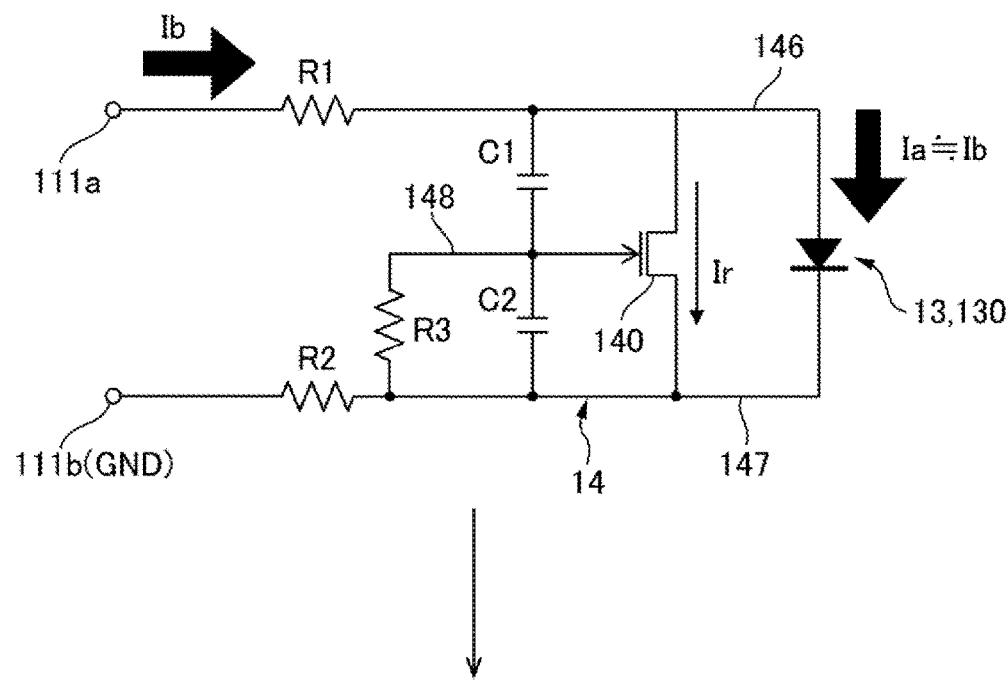
FIG. 7B 80°C
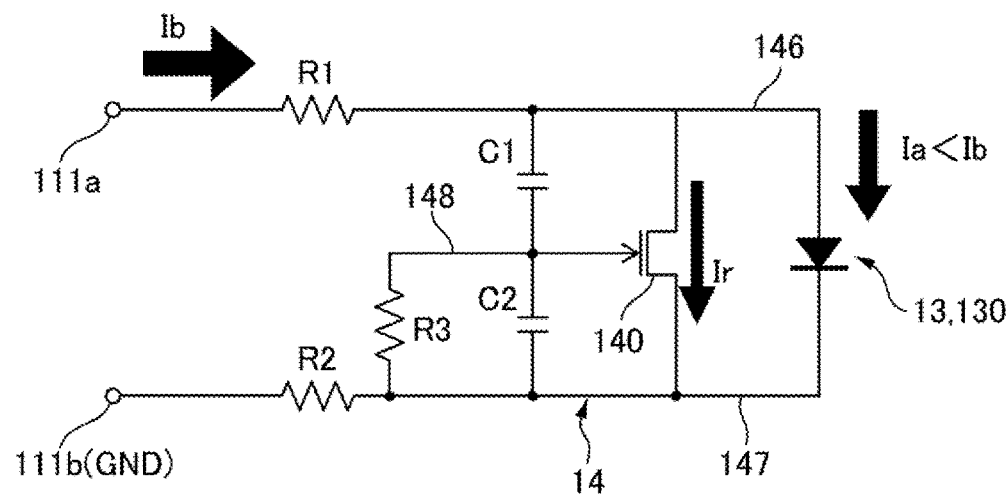

TEMPERATURE DETECTION CIRCUIT, ELECTRO-OPTICAL DEVICE, AND ELECTRONIC APPARATUS

The present application is based on, and claims priority from JP Application Serial Number 2019-181960, filed Oct. 2, 2019, the disclosure of which is hereby incorporated by reference herein in its entirety.

BACKGROUND

1. Technical Field

The present disclosure relates to a temperature detection circuit in which an electrostatic protection circuit is electrically coupled to a temperature detection element, an electro-optical device, and an electronic apparatus.

2. Related Art

In an electro-optical device such as a liquid crystal device or an organic electroluminescent display device, the temperature of the electro-optical device rises when an image is displayed. In particular, among such electro-optical devices, in a liquid crystal device used as a light valve in a projection-type display device, illumination light is irradiated with high intensity, causing the temperature of the liquid crystal device to readily rise. In such a case, while modulation characteristics and response characteristics of the liquid crystal layer change, as long as the projection-type display device is controlled on the basis of the result of detecting the temperature of the liquid crystal panel, the effect of temperature on the image can be mitigated. For example, as long as the cooling fan provided to the projection-type display device is controlled on the basis of the result of detecting the temperature of the liquid crystal panel, the effect of temperature on the image can be mitigated.

On the other hand, as a method for detecting the temperature of the liquid crystal device, a configuration has been proposed in which a temperature detection element is provided to a substrate in which pixels are formed, and an electrostatic protection circuit electrically coupled in parallel with the temperature detection element is provided (refer to JP-A-2016-184719).

In the technique described in JP-A-2016-184719, the temperature detection element is a diode, and a temperature dependency of a forward voltage of the diode when driven with a constant current is utilized to detect the temperature. In the case of a configuration in which the electrostatic protection circuit is electrically coupled to the temperature detection element, when the temperature rises, a leakage current of a transistor electrically coupled in parallel to the temperature detection element in the electrostatic protection circuit increases. Accordingly, due to the effect of the leakage current at high temperatures, a current smaller than a predetermined constant current flows to the temperature detection element, causing an output from the temperature detection element to fluctuate from an expected value. Therefore, in configurations in the related art, there is a problem in that the temperature of the display region cannot be properly monitored.

SUMMARY

To solve the problems described above, a temperature detection circuit according to the present disclosure includes an electrostatic protection circuit including a first wiring line, a first transistor provided with a first source/drain region electrically connected to the first wiring line, and a second wiring line electrically connected to a second source/drain region of the first transistor, a temperature detection element electrically connected to the first wiring line and the second wiring line, and a second transistor provided with a first source/drain region having a constant potential applied thereto and a second source/drain region electrically connected to the first wiring line.

The temperature detection circuit according to the present disclosure is used in, for example, an electro-optical device. In this case, the electro-optical device includes a first substrate provided with a plurality of pixels in a display region, and the temperature detection circuit is provided on an outer side of the display region in the first substrate.

An electro-optical device according to the present disclosure can be used in various electronic apparatuses. When the electronic apparatus is a projection-type display device, the projection-type display device includes a light source unit configured to emit light to be supplied to the electro-optical device, and a projection optical system configured to project light modulated by the electro-optical device.

BRIEF DESCRIPTION OF THE DRAWINGS

FIGS. 5A and 5B are explanatory views illustrating an action of compensating for a leakage current of an electrostatic protection circuit illustrated in FIG. 3.

FIGS. 6A and 6B are explanatory views of a voltage balance in the temperature detection circuit illustrated in FIG. 3.

FIGS. 7A and 7B are explanatory views illustrating an effect of leakage current in a comparative example in which a compensation circuit is not provided.

DESCRIPTION OF EXEMPLARY EMBODIMENTS

Figure 1:
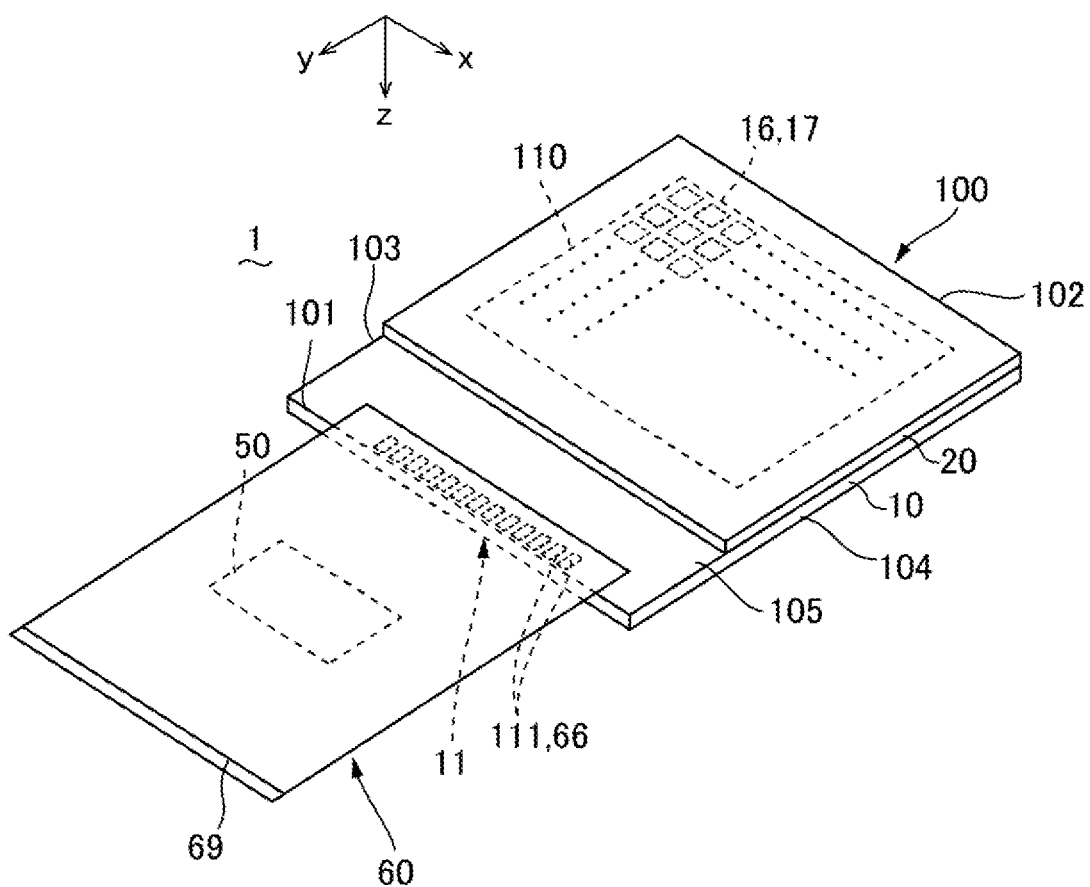
FIG. 1 is a perspective view of an embodiment of an electro-optical device to which the present disclosure is applied.

Exemplary embodiments of the disclosure will be described below with reference to the drawings. Note that, in each of the drawings referenced in the descriptions below, to make members and the like recognizable in terms of size in the drawings, the members and the like are illustrated in different scales, and a number of members is reduced. In the following, directions are expressed using an orthogonal coordinate system consisting of an x-axis, a y-axis, and a z-axis. A z-axis direction is a thickness direction of an electro-optical device 1, a y-axis direction is an extending direction of a wiring substrate, and an x-axis direction is a width direction orthogonal to the extending direction of the wiring substrate.

Configuration of Electro-Optical Device 1 Basic Configuration

FIG. 1 is a perspective view of an exemplary embodiment of the electro-optical device 1 to which the present disclosure is applied. In FIG. 1, the electro-optical device 1 is a liquid crystal device used as a light valve described later or the like, and includes a liquid crystal panel serving as an electro-optical panel 100. The electro-optical device 1 includes a plurality of pixel electrodes 16 formed on a first substrate 10, a common electrode (not illustrated) formed on a second substrate 20, and an electro-optical layer (not illustrated) formed from a liquid crystal layer provided between the pixel electrodes 16 and the common electrode. The pixel electrode 16 constitutes a pixel 17 by facing the common electrode with the electro-optical layer interposed therebetween. In the electro-optical device 1, the second substrate 20 is bonded to the first substrate 10 by a seal material (not illustrated). In the electro-optical device 1, a region surrounded by the seal material is provided with a liquid crystal layer (not illustrated). In the electro-optical device 1, a region in which the pixel electrodes 16 (pixels 17) are arranged in the x-axis direction and the y-axis direction is a display region 110.

The electro-optical device 1 of this exemplary embodiment is a transmission-type liquid crystal device. Accordingly, a substrate main body of the first substrate 10 and a substrate main body of the second substrate 20 are each formed from a light-transmitting substrate such as a heat-resistant glass or a quartz substrate. In the transmission-type electro-optical device 1, illumination light that enters from one substrate from among the first substrate and the second substrate is modulated from the time of entry to the time of exit from the other substrate, and is emitted as display light. In this exemplary embodiment, illumination light incident from the second substrate 20 is modulated from the time of entry to the time of exit from the first substrate 10, and emitted as display light. The electro-optical device 1 may include a first dust-proof glass having transmissivity and stacked and disposed on and adhered to a surface of the first substrate 10 opposite to the second substrate 20 side via an adhesive or the like, and a second dust-proof glass having transmissivity and stacked and disposed on a surface of the second substrate 20 opposite to the first substrate 10 side via an adhesive or the like.

The first substrate 10 includes a protruding portion 105 protruding in the y-axis direction from an end portion of the second substrate 20. The protruding portion 105 is provided with a terminal region 11 in which a plurality of terminals 111 are arranged at a predetermined pitch along a first side 101 extending in a width direction (x-axis direction) of the first substrate 10. The electro-optical device 1 includes a wiring substrate 60 that is flexible and coupled to the terminal region 11, and the wiring substrate 60 extends in the y-axis direction so as to be separated from the first substrate 10. The wiring substrate 60 includes an electrode 66 coupled, via an anisotropic conductive film, to the terminal 111 or the like at an end portion on the first substrate 10 side, while a terminal 69 such as a board-to-board connector is formed on an end portion on a side opposite to the side coupled to the first substrate 10. Further, an integrated circuit (IC) 50 for driving is mounted onto the wiring substrate 60 at an intermediate position in the extending direction.

Configuration of Electro-Optical Panel 100

Figure 2:
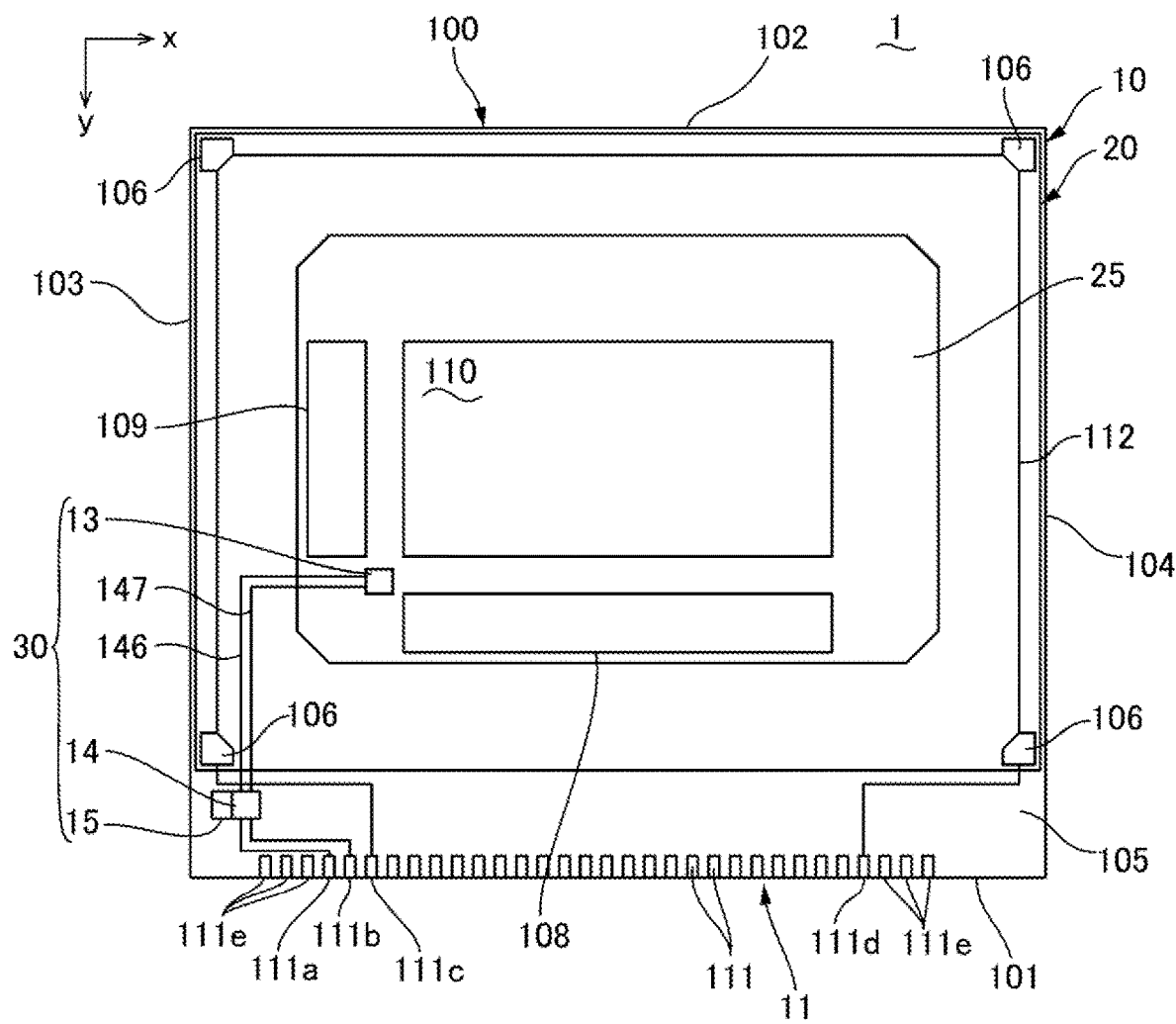
FIG. 2 is an explanatory view schematically illustrating a planar structure of an electro-optical panel illustrated in FIG. 1.

FIG. 2 is an explanatory view schematically illustrating a planar structure of the electro-optical panel 100 illustrated in FIG. 1. As illustrated in FIG. 2, in the electro-optical panel 100, a light-shielding portion 25 having a frame shape is formed on the second substrate 20, and an inner side of the light-blocking portion 25 is the display region 110. Inter-substrate conduction portions 106 are provided at positions of the first substrate 10 that overlap corner portions of the second substrate 20. Accordingly, a common potential LCCOM is supplied from the side of the first substrate 10 to the common electrode of the second substrate 20 via the inter-substrate conduction portions 106.

In the first substrate 10, a data line driving circuit 108 is provided between the terminal region 11 and the display region 110. The data line driving circuit 108 supplies an image signal to the plurality of pixel electrodes 16 illustrated in FIG. 1 via a data line (not illustrated) and a pixel switching element (not illustrated). Further, in the first substrate 10, a test circuit (not illustrated) may also be provided between a second side 102 facing the first side 101 and the display region 110. In the first substrate 10, a scanning line driving circuit 109 is provided between, from among a third side 103 and a fourth side 104 extending from both ends of the first side 101 in the y-axis direction, the third side 103 and the display region 110. The scanning line driving circuit 109 supplies a scanning signal to the pixel switching elements via a scanning line (not illustrated). The scanning line driving circuit 109 may be provided both between the third side 103 and the display region 110, and between the fourth side 104 and the display region 110. In this exemplary embodiment, the data line driving circuit 108 and the scanning line driving circuit 109 overlap the light-blocking portion 25 of the second substrate 20.

Configuration of Temperature Detection Circuit 30

Figure 3:
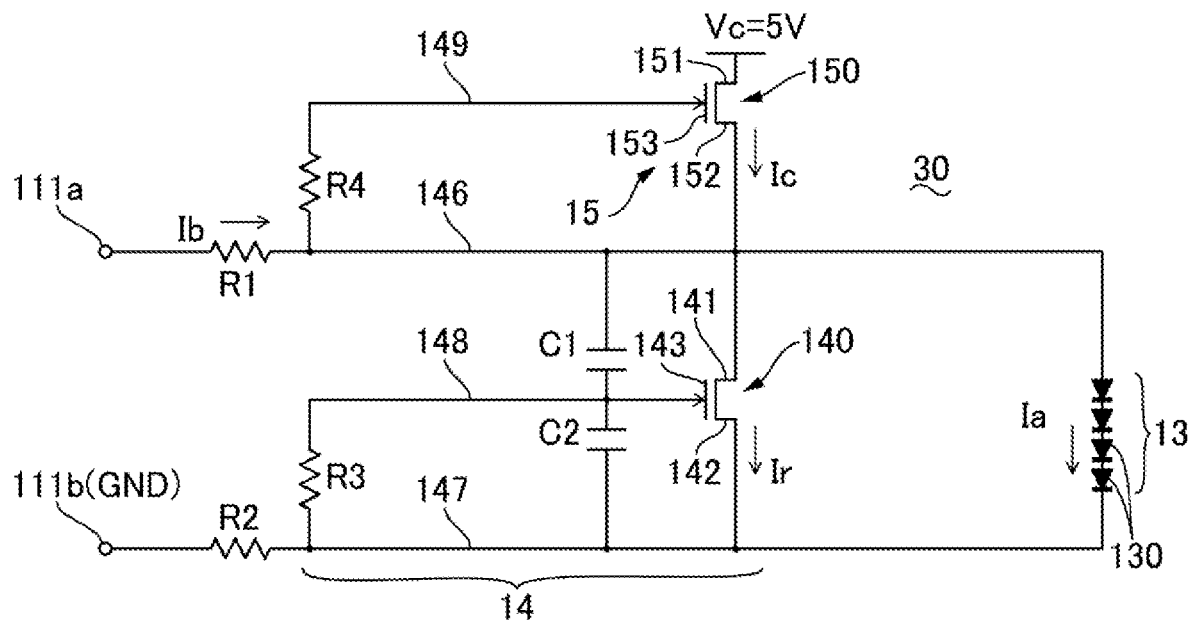
FIG. 3 is a circuit diagram of a temperature detection circuit illustrated in FIG. 2.
Figure 4:
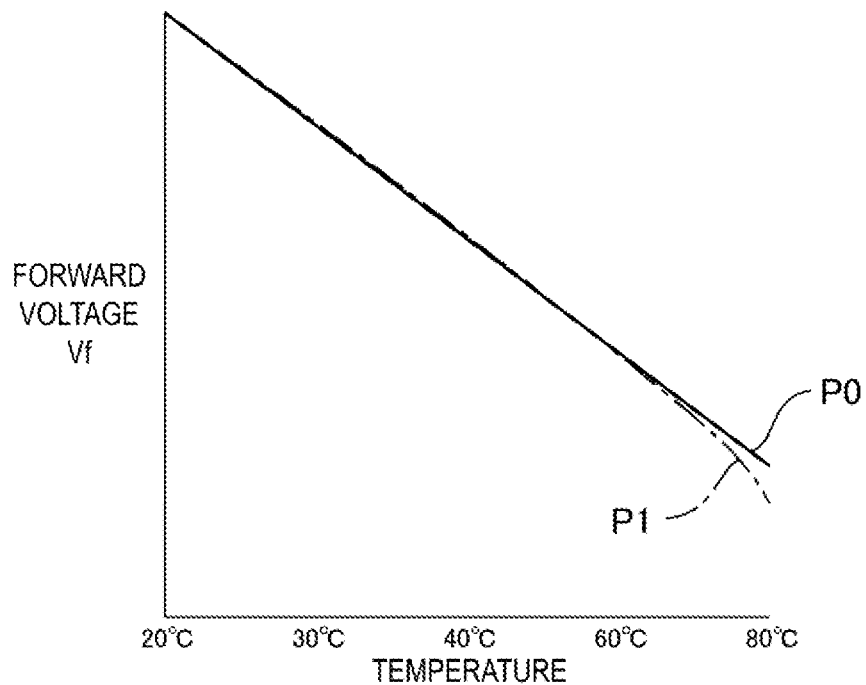
FIG. 4 is an explanatory view showing temperature characteristics of the temperature detection circuit illustrated in FIG. 3.

FIG. 3 is a circuit diagram of a temperature detection circuit 30 illustrated in FIG. 2. FIG. 4 is an explanatory view showing temperature characteristics of the temperature detection circuit 30 illustrated in FIG. 3.

As illustrated in FIG. 2, the first substrate 10 is provided with the temperature detection circuit 30 that detects a temperature of the electro-optical panel 100, and the temperature detection circuit 30 includes a temperature detection element 13 and a electrostatic protection circuit 14 electrically coupled to the temperature detection element 13. The temperature detection element 13 is provided at a position overlapping, in plan view, the light-blocking portion 25, and is close to the display region 110. Accordingly, the temperature detection element 13 can detect a temperature of the electro-optical panel 100 near the display region 110. In contrast, the electrostatic protection circuit 14 is provided in the vicinity of a corner of the first substrate 10, and the electrostatic protection circuit 14 is provided at a position further away from the display region 110 than the temperature detection element 13. In this exemplary embodiment, the temperature detection circuit 30 further includes a compensation circuit 15. In this exemplary embodiment, the compensation circuit 15 is provided in the vicinity of the electrostatic protection circuit 14. The temperature detection element 13, the electrostatic protection circuit 14, and the compensation circuit 15 are all formed utilizing a step of forming a pixel switching element or the like on the first substrate 10.

The temperature detection circuit 30 includes a first wiring line 146 and a second wiring line 147 respectively extending from two terminals 111a, 111b of the terminal 111. Further, a constant potential wiring line 112 that supplies the common potential LCCOM to the inter-substrate conduction portion 106 and the like extends from terminal 111c, 111d of the terminal 111. Note that the terminal 111 also includes a dummy terminal 111e.

As illustrated in FIG. 3, the electrostatic protection circuit 14 includes the first wiring line 146, a first transistor 140 provided with a first source/drain region 141 electrically coupled to the first wiring line 146, and the second wiring line 147 electrically coupled to a second source/drain region 142 of the first transistor 140. The first wiring line 146 includes a resistor R1, which is a resistance portion, and the second wiring line 147 includes a resistor R2, which is a resistance portion.

The temperature detection element 13 is electrically coupled to the first wiring line 146 and the second wiring line 147, and the temperature detection element 13 and the electrostatic protection circuit 14 are electrically coupled in parallel. More specifically, the temperature detection element 13 and the first transistor 140 of the electrostatic protection circuit 14 are electrically coupled in parallel. In this exemplary embodiment, the temperature detection element 13 consists of a diode 130, and both ends of the temperature detection element 13 are electrically coupled to the first wiring line 146 and the second wiring line 147, respectively. In this exemplary embodiment, a drive current Ib, which is a constant current, is supplied from the terminal 111a, and a ground potential GND is supplied to the terminal 111b. The ground potential GND supplied to the terminal 111b is separated from the ground potential GND supplied to the scanning line driving circuit 109, the data line driving circuit 108, or the electrostatic protection circuit of various drive signal wiring lines in the first substrate 10. This configuration reduces the effect of a drive noise of the scanning line driving circuit 109 and the data line driving circuit 108 on the temperature detection circuit 30. The resistor R1 mitigates a surge current entering from the terminal 111a and the resistor R2 mitigates a surge current entering from terminal 111b.

In this exemplary embodiment, the temperature detection element 13 consists of a plurality of the diodes 130 electrically coupled in series to increase a detection sensitivity of temperature change. In this exemplary embodiment, four diodes 130 are electrically coupled in series. The diode 130 may be in the form of not only a PN junction, but a transistor electrically coupled as a diode.

When a minute forward drive current Ib of about 100 nA to several µA is supplied from the terminal 111a to the temperature detection element 13 (diode 130) in the temperature detection circuit 30 thus configured, a current Ia flows through the temperature detection element 13. Here, as shown by a solid line P0 in FIG. 4, the forward voltage of the diode 130 constituting the temperature detection element 13 varies substantially linearly by temperature. Accordingly, because the voltage between the terminals 111a, 111b changes by temperature, the temperature of the electro-optical panel 100 can be detected by detecting the voltage between the terminals 111a, 111b.

At this time, when a leakage current Ir flowing through the first transistor 140 is negligibly small in a measurement temperature range, the current Ia flowing through the temperature detection element 13 is substantially equal to the drive current Ib supplied from the terminal 111a. Accordingly, as shown by the solid line P0 in FIG. 4, the temperature characteristics of the output voltage of the temperature detection circuit 30 are the temperature characteristics of the diode 130 of the temperature detection element 13, and vary substantially linearly relative to an environmental temperature. That is, a calibration curve can be established by linear approximation.

In the electrostatic protection circuit 14, a gate electrode 143 of the first transistor 140 is electrically coupled, via a first gate wiring line 148, to the second wiring line 147, between the resistor R2 and a cathode of the temperature detection element 13. The first gate wiring line 148 includes a resistor R3, which is a resistance portion. That is, the first gate wiring line 148 and the resistor R3 normally function as a connecting portion that turns off the first transistor. In such an electrostatic protection circuit 14, in a static state, a gate voltage Vgs of the first transistor 140 is 0V and the first transistor 140 is off. Further, a capacitor C1 is electrically coupled between the first gate wiring line 148 and the first wiring line 146, and a capacitor C2 is electrically coupled between the first gate wiring line 148 and the second wiring line 147.

Accordingly, a surge current caused by static electricity enters between the terminal 111a and the terminal 111b and, for example, when the potential on the terminal 111a side rises, the potential of a connection point between the capacitor C1 and the capacitor C2 (potential of the gate electrode 143 of the first transistor 140) rises while voltage fluctuation is suppressed by the resistor R1. As a result, the first transistor 140 is turned on, and thus the current due to the surge flows to the terminal 111b via the first transistor 140. Therefore, the current caused by the surge flowing to the temperature detection element 13 is suppressed by the electrostatic protection circuit 14, and thus the temperature detection element 13 can be protected.

Configuration of Compensation Circuit 15

In the temperature detection circuit 30 thus configured, when the temperature of the electro-optical panel 100 rises and the leakage current Ir at the first transistor 140 increases, because the characteristics shown by the solid line P0 in FIG. 4 attempt to change to the characteristics shown by a dot-dash line P1, the temperature detection circuit 30 according to this exemplary embodiment is provided with the compensation circuit 15 for compensating for the leakage current Ir of the first transistor 140.

In this exemplary embodiment, the compensation circuit 15 includes a second transistor 150, a first source/drain region 151 of the second transistor 150 has a constant potential Vc applied thereto, and a gate electrode 153 and a second source/drain region 152 of the second transistor 150 are electrically coupled to the first wiring line 146. In this exemplary embodiment, the second source/drain region 152 is electrically coupled to the first wiring line 146 between the resistor R1 and an anode of the temperature detection element 13. A second gate wiring line 149 electrically coupled to the gate electrode 153 is electrically coupled to the first wiring line 146 between a connection position of the second source/drain region 152 and the resistor R1, and the second gate wiring line 149 includes a resistor R4 that is a resistance portion. That is, the second gate wiring line 149 and the resistor R4 normally function as a connecting portion that turns off the second transistor. Note that the configuration may be one in which the resistor R4 is not provided.

Note that, in this exemplary embodiment, the constant potential Vc other than the common potential LCCOM is supplied to the first source/drain region 151. Accordingly, the constant potential wiring line is extended to the temperature detection circuit 30 from any of the terminals 111 illustrated in FIG. 2. However, as in the second exemplary embodiment described below, when the common potential LCCOM is supplied to the first source/drain region 151 as the constant potential Vc, the constant potential wiring line 112 is utilized to supply the constant potential Vc.

Action of Temperature Detection Circuit 30

The operation and the like of the compensation circuit 15 of the temperature detection circuit 30 will be described with reference to FIGS. 5A and 5B, FIGS. 6A and 6B, and FIGS. 7A and 7B. FIGS. 5A and 5B are explanatory views illustrating the action of compensating for the leakage current of the electrostatic protection circuit 14 illustrated in FIG. 3, with FIG. 5A illustrating a current balance at a temperature of 30° C. and FIG. 5B illustrating a current balance when the temperature rises to 80° C. FIGS. 6A and 6B are explanatory views of a voltage balance in the temperature detection circuit 30 illustrated in FIG. 3, with FIG. 6A illustrating a voltage balance at a temperature of 30° C. and FIG. 6B illustrating a voltage balance when the temperature rises to 80° C. FIGS. 7A and 7B are explanatory views illustrating the effect of leakage current in a comparative example in which the compensation circuit 15 is not provided, with FIG. 7A illustrating a current balance at a temperature of 30° C. and FIG. 7B illustrating a current balance when the temperature rises to 80° C.

In this exemplary embodiment, the elements and the like illustrated in FIG. 3, for example, have the configuration below, the first transistor 140 and the second transistor 150 are of a same conductivity type, and the respective channel lengths and channel widths are equal.

First transistor 140
Conductivity type=N type
Channel width W=From 400 to 800 μm
Channel length L=From 5 to 8 μm
Second transistor 150
Conductivity type=N type
Channel width W=From 400 to 800 μm
Channel length L=From 5 to 8 μm
Voltage applied to source/drain region 151 on one side:
Constant potential Vc=5V
Electrostatic capacitance value of capacitor C1: From 1 to 5 pF
Electrostatic capacitance value of capacitor C2: From 1 to 5 pF
Resistance value of resistor R1: From 3 to 10 kΩ)
Resistance value of resistor R2: From 3 to 10 kΩ
Resistance value of resistor R3: From 500 to 1000 kΩ
Resistance value of resistor R4: From 1 to 50 kΩ

The diode 130 used in the temperature detection element 13 according to this exemplary embodiment has per element, for example, a forward current If from 10 nA to 1 μA, in the vicinity of a forward voltage Vf=0.7V. Accordingly, the forward voltage Vf when the forward current If (drive current Ib) is supplied to the temperature detection element 13 in which the four diodes 130 are coupled in series is in the vicinity of 2.8V (=0.7V×4) at room temperature (30° C.). Here, the forward voltage Vf per element of the diode 130 decreases from approximately 1.7 mV to 2.0 mV with a temperature rise of 1° C. In the following description, the voltage changes by −2.0 mV with a temperature rise of 1° C. Accordingly, when the four diodes 130 are used in the temperature detection element 13, when the temperature rises by 50° C., from 30° C. to 80° C., the forward voltage decreases by about 0.4V (=2.0 mV/° C.×50° C.×4).

In the temperature detection circuit 30 according to this exemplary embodiment, as illustrated by the current balance in FIG. 5A and the voltage balance in FIG. 6A, when the drive current Ib flows to the temperature detection circuit 30 under conditions of a temperature of 30° C., the leakage current Ir corresponding to a voltage Vds=2.8V between the source and the drain and the gate voltage Vgs=0V flows to the first transistor 140. At this time, a compensation current Ic corresponding to the voltage Vds=2.2V (=5V-2.8V) between the source and the drain and the gate voltage Vgs=0V flows to the second transistor 150. At 30° C., because the leakage current Ir and the compensation current Ic are sufficiently small compared to the drive current Ib, the current Ia flowing to the temperature detection element 13 can be considered equal to the drive current Ib.

In contrast, when the drive current Ib flows through the temperature detection circuit 30 when the temperature rises to 80° C., as illustrated by the current balance in FIG. 5B and the voltage balance in FIG. 6B, the leakage current Ir corresponding to the voltage Vds=2.4V (=2.8V-0.4V) between the source and the drain and the gate voltage Vgs=0V flows to the first transistor 140. At this time, the compensation current Ic corresponding to the voltage Vds=2.6V (=5V-2.4V) between the source and the drain and the gate voltage Vgs=0V flows to the second transistor 150. At this time, because the current flowing through the first transistor 140 and the second transistor 150 is a current obtained by a temperature rise to 80° C., the current is greater than that when the temperature is 30° C. At this time, the current Ia flowing to the temperature detection element 13 is given by the following formula according to Kirchhoff's law.

$$Ia=Ib+Ic-Ir \quad \text{Formula 1}$$

Where, the signs of the currents are defined as follows:
Ia: Current from the terminal 111a toward the temperature detection element 13 is positive
Ib: Current from the anode to the cathode of the temperature detection element 13 is positive
Ic: Current from the constant potential (5V) side of the second transistor
150 toward the first wiring line 146 side is positive
Ir: Current from the first wiring line 146 side of the first transistor
140 toward the second wiring line 147 side is positive Here, in the first transistor 140 and the second transistor 150, the channel lengths and the channel widths are equal and the voltages Vds between the source and the drain are substantially equal, and thus the leakage current Ir and the compensation current Ic are substantially equal. Accordingly, the current Ia flowing to the temperature detection element 13 is substantially equal to the drive current Ib. Therefore, even in a case in which the temperature rises, as shown by the solid line P0 in FIG. 4, the temperature characteristics of the output voltage of the temperature detection circuit 30 change substantially linearly relative to the environmental temperature, and thus the calibration curve can be established by linear approximation. In this manner, an operating point voltage of the temperature detection element 13 is preferably configured to approach the constant potential Vc/2 at a higher temperature than room temperature.

In contrast, as illustrated in FIGS. 7A and 7B, in a comparative example in which the compensation circuit 15 is not provided, while the current Ia flowing to the temperature detection element 13 under conditions of a temperature of 30° C. can be considered equal to the drive current Ib, in a case in which the temperature rises to 80° C., the current Ia flowing to the temperature detection element 13 is much smaller than the drive current Ib due to the effect of the leakage current Ir. Therefore, as illustrated by the dot-dash line P1 in FIGS. 6A and 6B, the temperature characteristics of the temperature detection circuit 30 change from the temperature characteristics of the diode 130 constituting the temperature detection element 13. Accordingly, it is difficult to establish the calibration curve by linear approximation.

Main Effects of Exemplary Embodiment

As described above, in this exemplary embodiment, the compensation circuit 15 is provided to the temperature detection circuit 30 and thus, even when the temperatures of the electrostatic protection circuit 14 and the compensation circuit 15 disposed adjacent thereto rise, because compensation can be made for the leakage current Ir of the first transistor 140 of the electrostatic protection circuit 14 by the compensation current Ic of the compensation circuit 15, the degree to which the temperature characteristics of the temperature detection element 13 deviates from the linear characteristic of the diode 130 can be reduced. Accordingly, a temperature measurement error can be reduced. Further, the electrostatic protection circuit 14 and the compensation circuit 15 disposed adjacent thereto have an increased degree of freedom of arrangement within the first substrate 10, making design easier.

That is, the first transistor 140, in order to realize a function as a discharge circuit, has a relatively large channel width, and when the temperature rises to 80° C., for example, the leakage current Ir is no longer negligible. In this case, the current Ia flowing through the temperature detection element 13 is a value obtained by subtracting the leakage current Ir from the drive current Ib. Moreover, the leakage current Ir of the first transistor 140 increases exponentially due to the rise in temperature. Accordingly, as shown by the dot-dash line P1 in FIG. 4, the temperature characteristics of the output voltage of the temperature detection circuit 30 are affected by the leakage current Ir of the first transistor 140 and thus change from the temperature characteristics of the diode 130 constituting the temperature detection element 13. Specifically, the current Ia flowing through the temperature detection element 13 becomes (drive current Ib—leakage current Ir), which causes the voltage to deviate to an output voltage smaller than that of the original temperature characteristics of the diode 130 constituting the temperature detection element 13. In particular, deviation in a high-temperature region is large. In other words, it becomes difficult to linearly approximate the temperature characteristics of the output voltage of the temperature detection circuit. In such a case, the calibration curve requires multipoint calibration, for example, and the work to find the calibration curve becomes enormous. Accordingly, manufacturing costs increase. Further, the variation in the leakage current of the first transistor 140 readily causes a variation in the calibration curve, making production exceedingly difficult. To make the leakage current Ir negligible, there is a method of increasing the drive current Ib. Nevertheless, in order to increase the drive current Ib, for example, the temperature detection element 13 needs to be largely formed, making it difficult to dispose the temperature detection element 13 near the display region 110. Thus, in this exemplary embodiment, compensation for the leakage current Ir of the first transistor 140 of the electrostatic protection circuit 14 can be made by the compensation circuit 15 using the compensation current Ic of the compensation circuit 15.

Further, because the first transistor 140 and the second transistor 150 are of the same conductivity type, the characteristic fluctuations are the same for the first transistor 140 and the second transistor 150 even when there are characteristic fluctuations in the transistors in the manufacturing process. Accordingly, compensation for the leakage current Ir can be properly made by the compensation current Ic. Further, because the channel widths and the channel lengths of the first transistor 140 and the second transistor 150 are the same, compensation for the leakage current Ir can be properly made by the compensation current Ic.

Note that, in a case in which the potential of the first wiring 146 rises above the constant potential (5V) and exceeds a threshold voltage of the second transistor 150 due to a surge current, the second transistor 150 may also serve as a discharge path for the surge current. That is, the second transistor 150 has an action of compensating for the temperature characteristics of the temperature detection circuit 30 and an action of enhancing electrostatic breakdown prevention of the temperature detection element 13. Specifically, when a surge current caused by static electricity enters between the terminal 111a and the terminal 111b and, for example, the potential on the terminal 111a side rises, the potential of the connection point between the capacitor C1 and the capacitor C2 (the potential of the gate electrode 143 of the first transistor 140) rises while the voltage fluctuation is suppressed by the resistor R1. As a result, the first transistor 140 is turned on, and thus the current due to the surge flows to the terminal 111b via the first transistor 140. In a case in which the potential of the terminal 111a side (first wiring 146) continues to rise, rises above the constant potential (5V), and exceeds the threshold voltage of the second transistor 150, a surge current flows to the constant potential side via the second transistor 150 as well. The discharge capacity is thus improved by the first transistor and the second transistor.

Second Exemplary Embodiment

Figure 8:
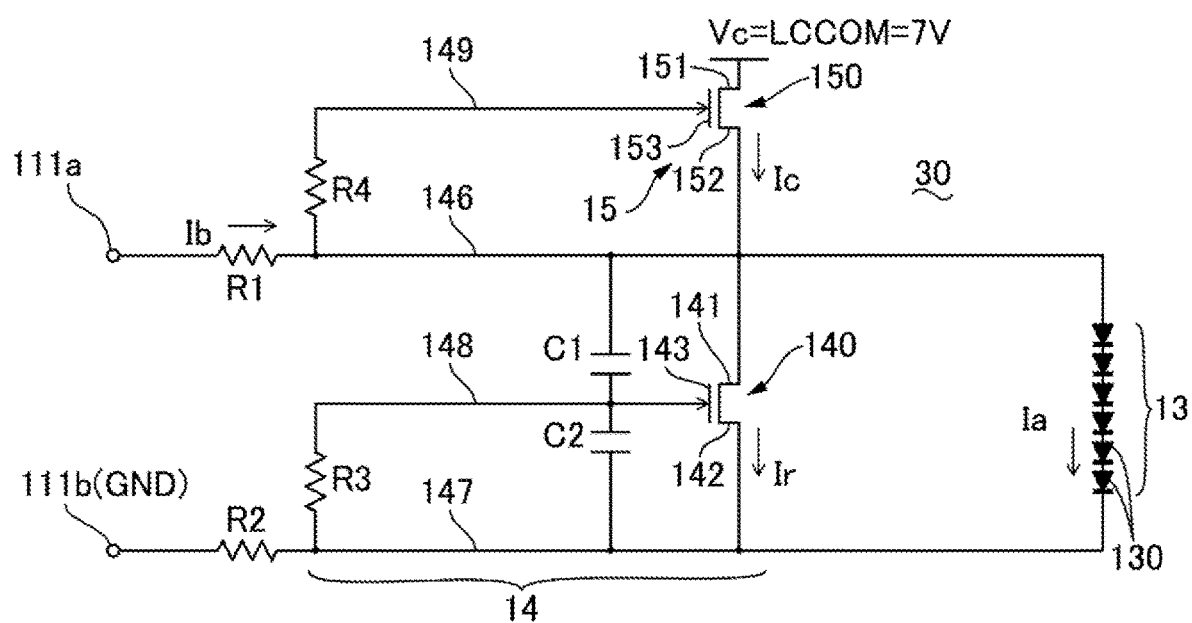
FIG. 8 is an explanatory view of the temperature detection circuit of the electro-optical device according to a second exemplary embodiment of the present disclosure.
Figure 9:
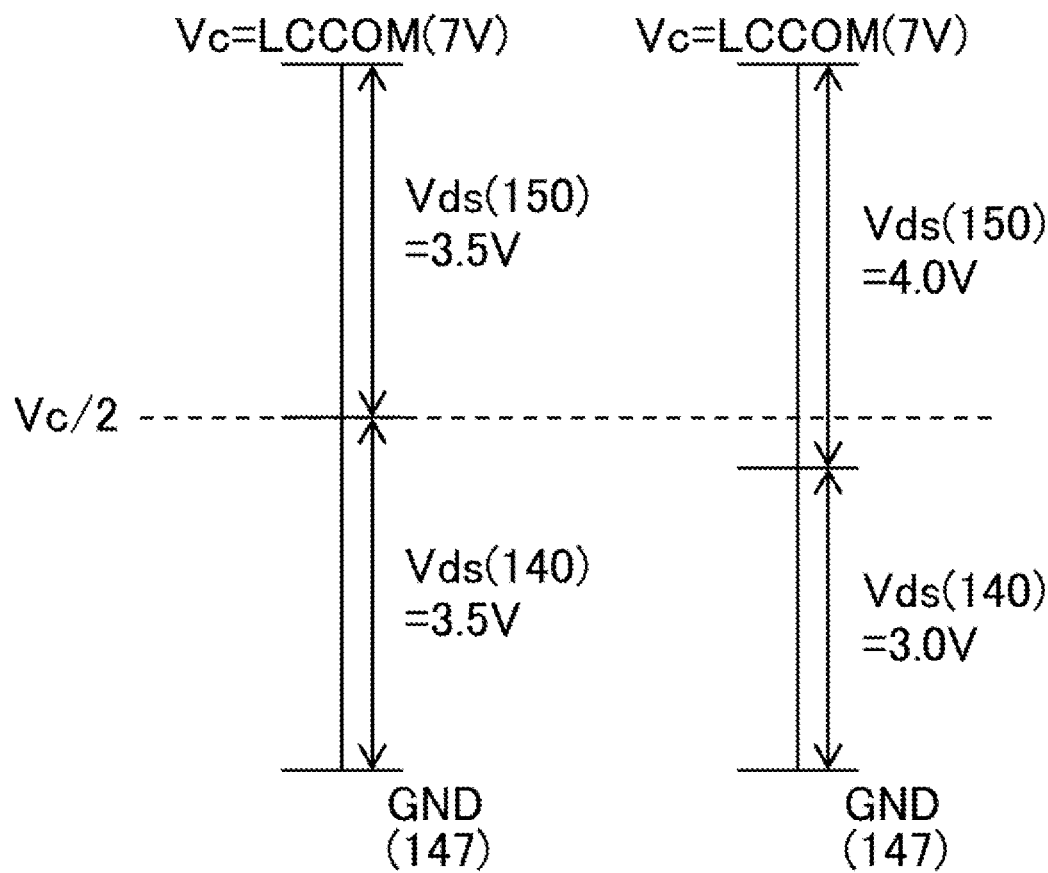
FIGS. 9A and 9B are explanatory views of a voltage balance in the temperature detection circuit illustrated in FIG. 8.

FIG. 8 is an explanatory view of the temperature detection circuit 30 of the electro-optical device 1 according to a second exemplary embodiment of the present disclosure. FIGS. 9A and 9B are explanatory views of the voltage balance in the temperature detection circuit 30 illustrated in FIG. 8, with FIG. 9A illustrating a voltage balance at a temperature of 30° C. and FIG. 9B illustrating a voltage balance when the temperature rises to 80° C. Note that the basic configuration of this exemplary embodiment is the same as in the first exemplary embodiment, and thus common portions are denoted by the same reference signs and a description of the common portions will be omitted.

As illustrated in FIG. 8, in the electro-optical device 1 of this exemplary embodiment as well, similar to the first exemplary embodiment, the temperature detection circuit 30 that detects a temperature of the electro-optical panel is provided, and the temperature detection circuit 30 includes the temperature detection element 13 and the electrostatic protection circuit 14 electrically coupled to the temperature detection element 13. Further, the temperature detection circuit 30 includes the compensation circuit 15.

Similar to the first exemplary embodiment, the electrostatic protection circuit 14 includes the first wiring line 146, the first transistor 140 provided with the first source/drain region 141 electrically coupled to the first wiring line 146, and the second wiring line 147 electrically coupled to the second source/drain region 142 of the first transistor 140. The temperature detection element 13 is electrically coupled to the first wiring line 146 and the second wiring line 147, and the temperature detection element 13 and the electrostatic protection circuit 14 are electrically coupled in parallel. More specifically, the temperature detection element 13 and the first transistor 140 of the electrostatic protection circuit 14 are electrically coupled in parallel. The compensation circuit 15 includes the second transistor 150, the first source/drain region 151 of the second transistor 150 has the constant potential Vc applied thereto, and the gate electrode 153 and the second source/drain region 152 of the second transistor 150 are electrically coupled to the first wiring line 146.

While, in the first exemplary embodiment, the temperature detection element 13 includes the four diodes 130 electrically coupled in series, in this exemplary embodiment, the temperature detection element 13 includes six diodes 130 electrically coupled in series. Thus, the sensitivity of the temperature detection element 13 can be increased.

Further, while in the first exemplary embodiment the constant potential Vc applied to the first source/drain region 151 of the second transistor 150 is 5V, in this exemplary embodiment, the constant potential Vc applied to the first source/drain region 151 is 7V, which is the common potential LCCOM of the electro-optical panel 100. Therefore, there is no need to add a dedicated new constant potential to the electro-optical panel 100. The rest of the configuration is the same as in the first exemplary embodiment.

The temperature detection element 13 in this exemplary embodiment has a forward current If of 100 nA near the forward voltage Vf=3.5V. The forward voltage Vf of the temperature detection element 13 decreases by approximately 10 mV at a temperature rise of 1° C., and thus the forward voltage decreases by about 0.5V (=10 mV/° C.×50° C.) when the temperature rises from 30° C. to 80° C.

In the temperature detection circuit 30 according to this exemplary embodiment, as illustrated by the voltage balance in FIG. 9A, when the drive current Ib flows to the temperature detection circuit 30 under conditions of a temperature of 30° C., the leakage current Ir corresponding to the voltage Vds=3.5V between the source and the drain and the gate voltage Vgs=0V flows to the first transistor 140. At this time, the compensation current Ic corresponding to the voltage Vds=3.5V (=7V-3.5V) between the source and the drain and the gate voltage Vgs=0V flows to the second transistor 150. At 30° C., because the leakage current Ir and the compensation current Ic are sufficiently smaller than the drive current Ib, the current Ia flowing to the temperature detection element 13 can be considered equal to the drive current Ib.

In contrast, when the temperature rises to 80° C. and the drive current Ib is supplied to the temperature detection circuit 30, a leakage current Ir corresponding to the voltage Vds=3.0V (=3.5V-0.5V) between the source and the drain and the gate voltage Vgs=0V flows, as illustrated by the voltage balance in FIG. 9B. At this time, the compensation current Ic corresponding to the voltage Vds=4.0V between the source and the drain and the gate voltage Vgs=0V flows to the second transistor 150. At this time, because the current flowing through the first transistor 140 and the second transistor 150 is a current obtained by a temperature rise to 80° C., the current is greater than that when the temperature is 30° C. At this time, the current Ia flowing to the temperature detection element 13 is given by the following formula according to Kirchhoff's law.

$$Ia=Ib+Ic-Ir \quad \text{Formula 2}$$

Here, in the first transistor 140 and the second transistor 150, because there is a 1.0V difference in the voltages Vds between the source and the drain, there is a difference between the leakage current Ir and the compensation current Ic. In this case as well, the effect of the leakage current Ir can be mitigated by the compensation current Ic.

More specifically, in the first transistor 140 and the second transistor 150, a ratio of the currents when there is a 1.0V difference in the voltage Vds between the source and the drain (compensation current Ic/leakage current Ir) is about 1.1, and the difference between the compensation current Ic and the leakage current Ir is 0.1 times the leakage current Ir. That is, when compared with the configuration in the related art, the effect of the leakage current Ir at 80° C. is reduced by the compensation current Ic by 1/10 with a change in sign.

Modification of Second Exemplary Embodiment

For the constant potential Vc applied to the first source/drain region 151 of the second transistor 150, it is possible to have a potential higher than the common potential LCCOM (7V) of the electro-optical panel 100 as well. In this case, the difference in the voltages Vds between the source and the drain between the first transistor 140 and the second transistor 150 increases. More specifically, when the ratio of the currents (compensation current Ic/leakage current Ir) is greater than about 2, the current flowing to the diode 130 has the following value:

$$Ia=Ib+Ic-Ir=Ib+2\times Ir-Ir=Ib+Ir \quad \text{Formula 3}$$

On the other hand, in the configuration in the related art, the current flowing through the diode 130 has the following value:

$$Ia=Ib-Ir \quad \text{Formula 4}$$

In this case, the effect on the drive current Ib changes in sign and is the same as that of the configuration in the related art. That is, the compensation current Ic is too large, making the absolute value of the temperature measurement error the same as that of the configuration in the related art, and the effect of providing the second transistor 150 small. In this exemplary embodiment, the difference in the voltages Vds between the source and drain is approximately 8V when the ratio of the currents (compensation current Ic/leakage current Ir) is 2 at a temperature is 80° C. Accordingly, the constant potential Vc applied to the second transistor 150 is preferably (source-drain voltage of first transistor 140+8V) or less. That is, the constant potential Vc applied to the second transistor 150 preferably satisfies the conditional expression below under conditions of a temperature of 80° C. or less:

Constant potential $Vc$(Source/drain voltage $Vds+8V$ of first transistor 140)      Formula 5

According to such a configuration, overcompensation due to the compensation current Ic can be suppressed.

Furthermore, as in the first exemplary embodiment, the voltage Vds between the source and the drain of the first transistor 140 at 80° C. and the voltage Vds between the source and the drain of the second transistor 150 are preferably substantially equal.

Note that, because the temperature of 80° C. is close to a practical upper limit temperature of the electro-optical panel 100, it is reasonable to set an environment of 80° C. as the upper limit of the operating point potential of the diode 130.

Third Exemplary Embodiment

In the second exemplary embodiment, the temperature detection element 13 is constituted by the six diodes 130, the constant potential Vc applied to the first source/drain region 151 of the second transistor 150 is the common potential LCCOM (7V), and the ratio of the currents (compensation current Ic/leakage current Ir) at 80° C. is 1.1 as a result. In this exemplary embodiment, the first transistor 140 and the second transistor 150 are of the same conductivity type, but have different channel lengths or channel widths in order to reduce the difference in current values between the compensation current Ic and the leakage current Ir at a temperature of 80° C. In this exemplary embodiment, as described below, while the channel widths of the first transistor 140 and the second transistor 150 are equal, the channel width of the second transistor 150 is approximately 10% narrower than the channel width of the first transistor 140. Accordingly, in the second transistor 150, the value obtained by dividing the channel width by the channel length is smaller than that of the first transistor 140.

First transistor 140
   Conductivity type=N type
   Channel width W=800 μm
   Channel length L=5 μm Second transistor 150
   Conductivity type=N type
   Channel width W=700 μm
   Channel length L=5 μm
   Voltage applied to source/drain region 151 on one side:
Constant potential Vc=7V Accordingly, while in the second exemplary embodiment there is difference of 1.0V in the voltages Vds between the source and the drain in an 80° C. environment between the first transistor 140 and the second transistor 150 and, as a result, the ratio of the currents (compensation current Ic/leakage current Ir) is approximately 1.1, according to this exemplary embodiment, in the second transistor 150, the value obtained by dividing the channel width by the channel length is set approximately 10% smaller than that of the first transistor 140, and thus the compensation current Ic and the leakage current Ir can be made substantially equal even in a case where there is a difference of 1.0V in the voltages Vds between the source and the drain between the first transistor 140 and the second transistor 150.

Note that, in this exemplary embodiment, while the channel lengths of the first transistor 140 and the second transistor 150 are equal, and the channel width of the second transistor 150 is narrower than the channel width of the first transistor 140, as configurations in which at least one of the channel lengths and the channel widths are different in the first transistor 140 and the second transistor 150, a mode in which the channel lengths are different or a mode in which both the channel lengths and the channel widths are different may be adopted. In any case, a mode is adopted in which (channel width/channel length) is made to differ between the first transistor 140 and the second transistor 150, thereby making the compensation current Ic and the leakage current Ir substantially equal, even when the voltages Vds between the source and the drain differ between the first transistor 140 and the second transistor 150.

Other Exemplary Embodiments

In the exemplary embodiments described above, the electro-optical device 1 is the transmission-type liquid crystal device. However, the present disclosure may be applied to a case in which the electro-optical device 1 is a reflection-type liquid crystal device or a case in which the electro-optical device 1 is an organic electro-luminescent device.

Example of Installation to Electronic Apparatus

Figure 10:
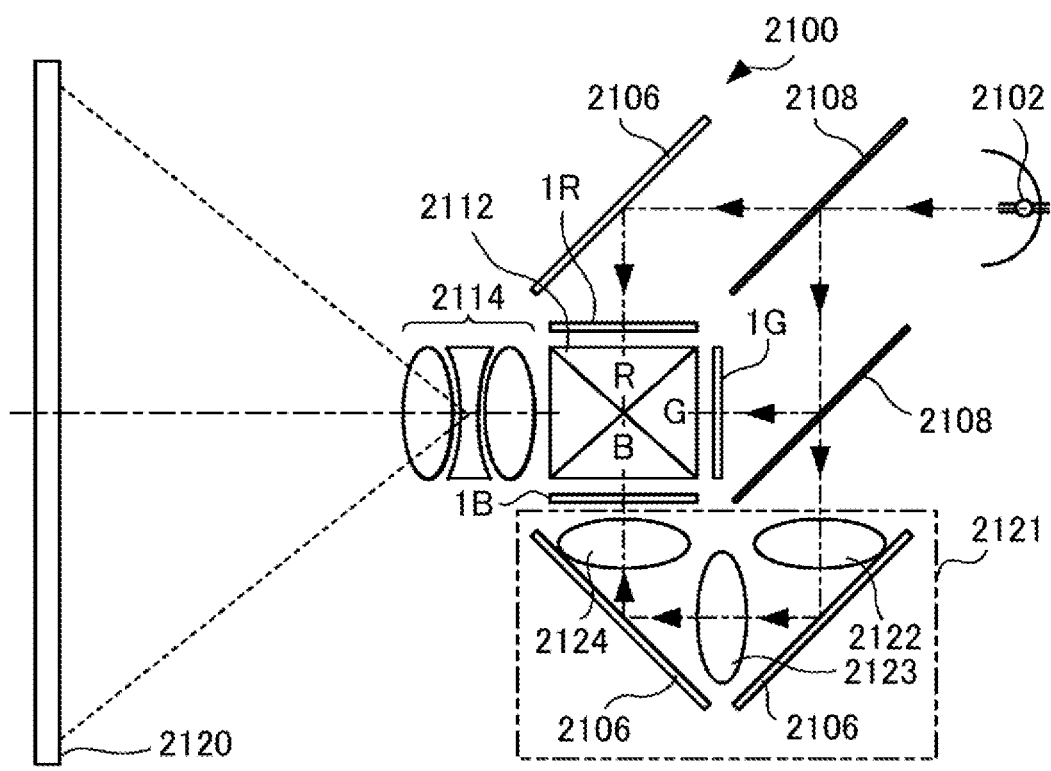
FIG. 10 is a schematic configuration view of a projection-type display device using an electro-optical device to which the present disclosure is applied.

An electronic apparatus using the electro-optical device 1 according to the exemplary embodiments described above will be described below. FIG. 10 is a schematic configuration view of a projection-type display device (electronic apparatus) using the electro-optical device 1 to which the present disclosure is applied. The projection-type display device 2100 illustrated in FIG. 10 is an example of an electronic apparatus using the electro-optical device 1. In the projection-type display device 2100, the electro-optical device 1 to which the present disclosure is applied is used as a light valve, making it possible to conduct high-definition and bright display without making the device large. As illustrated in this drawing, a lamp unit 2102 (light source unit) including a white light source such as a halogen lamp is provided inside the projection-type display apparatus 2100. Projection light emitted from the lamp unit 2102 is split into three primary colors of R (red), G (green), and B (blue) by three mirrors 2106 and two dichroic mirrors 2108 installed inside. The split projection light is guided to light valves 1R, 1G, and 1B corresponding to the primary colors, respectively. Note that since the light of the B color has a long optical path as compared to the other light of the R color and the G color, the light of the B color is guided via a relay lens system 2121 including an incidence lens 2122, a relay lens 2123, and an emission lens 2124 to prevent a loss due to the long optical path of the light of the B color.

In the projection-type display device 2100, the configuration of the light valves 1R, 1G, and 1B is the same as that of the electro-optical device 1 described with reference to FIG. 1 and the like, and the light valves 1R, 1G, and 1B are each coupled, via the wiring substrate 60 illustrated in FIG. 1 and the like, to an upper circuit in the projection-type display device 2100. Image signals specifying the gray scale levels of the respective primary components of the R color, the G color, and the B color are respectively supplied from an external upper circuit and processed by the upper circuit in the projection-type display device 2100, and the light valves 1R, 1G, and 1B are respectively driven. The light modulated by each of the light valves 1R, 1G, and 1B is incident on a dichroic prism 2112 from three directions. Then, at the dichroic prism 2112, the light of the R color and the light of the B color are reflected at 90 degrees, and the light of the G color is transmitted. Accordingly, images of the primary colors are synthesized, and subsequently a color image is projected on a screen 2120 by a projection lens group 2114 (projection optical system).

A cooling fan (not illustrated) for cooling the light valves 1R, 1G, and 1B is provided to such a projection-type display device 2100. Accordingly, as long as the cooling fan is controlled on the basis of the detection result of the temperature detection circuit 30 illustrated in FIG. 3 and the like, the effect of temperature on the light valves 1R, 1G, and 1B with respect to the image can be mitigated.

Other Projection-Type Display Devices

Note that the projection-type display device may be configured so that an LED light source or the like that emits light of each color is used as a light source unit and the light of each color emitted from such an LED light source is supplied to another liquid crystal device. Note that the pixel may be configured by adopting a display element (microelectromechanical systems (MEMS) device) such as a digital micromirror device (DMD).

Other Electronic Apparatuses

The electronic apparatus including the electro-optical device 1 to which the present disclosure is applied is not limited to the projection-type display device 2100 of the exemplary embodiment described above. Examples of the electronic apparatus may include a projection-type head-up display (HUD), a direct-view-type head-mounted display (HMD), a personal computer, a digital still camera, a liquid crystal television, and the like.

What is claimed is:

1. A temperature detection circuit comprising:
an electrostatic protection circuit including
a first wiring line including a resistance portion,
a first transistor provided with a first source/drain region electrically connected to the first wiring line,
a second wiring line electrically connected to a second source/drain region of the first transistor,
a first gate wiring line directly connecting a gate electrode of the first transistor to the second wiring line, and
a second gate wiring line directly connecting a gate electrode of the second transistor to the first wiring line;
a temperature detection element electrically connected to the first wiring line and the second wiring line; and
a second transistor provided with a first source/drain region having a constant potential applied thereto and a second source/drain region electrically connected to the first wiring line, wherein
the first source/drain region of the first transistor and the second source/drain region of the second transistor are directly connected to the first wiring line between the resistance portion and the temperature detection element.

2. The temperature detection circuit according to claim 1, wherein
the first gate wiring line and the second gate wiring line each include a resistance portion.

3. The temperature detection circuit according to claim 1, wherein
the first transistor and the second transistor are of a same conductivity type.

4. The temperature detection circuit according to claim 3, wherein
the first transistor and the second transistor have an equal channel length and an equal channel width.

5. The temperature detection circuit according to claim 4, wherein
the constant potential≤(source/drain voltage of the first transistor+8V) under the condition of a temperature of 80° C. or less.

6. The temperature detection circuit according to claim 1, wherein
the first transistor and the second transistor have different channel lengths or channel widths.

7. An electro-optical device comprising:
the temperature detection circuit according to claim 1; and
a first substrate provided with a plurality of pixel electrodes in a display region, wherein
the temperature detection circuit is provided on an outer side of the display region of the first substrate.

8. The electro-optical device according to claim 7, comprising:
a second substrate facing the first substrate and provided with a common electrode overlapping the plurality of pixel electrodes, wherein
the first source/drain region of the second transistor is applied with, as the constant potential, a common potential applied to the common electrode.

9. An electronic apparatus comprising:
the electro-optical device according to claim 7.

10. The electro-optical device according to claim 7, wherein the first transistor and the second transistor are a further distance from the display region than the temperature detection element is.

* * * * *